US011619592B2

(12) United States Patent
Brauer et al.

(10) Patent No.: US 11,619,592 B2
(45) Date of Patent: Apr. 4, 2023

(54) SELECTING DEFECT DETECTION METHODS FOR INSPECTION OF A SPECIMEN

(71) Applicant: KLA Corporation, Milpitas, CA (US)

(72) Inventors: Bjorn Brauer, Beaverton, OR (US); Hucheng Lee, Cupertino, CA (US); Sangbong Park, Dublin, CA (US)

(73) Assignee: KLA Corp., Milpitas, CA (US)

( * ) Notice: Subject to any disclaimer, the term of this patent is extended or adjusted under 35 U.S.C. 154(b) by 0 days.

(21) Appl. No.: 16/910,011

(22) Filed: Jun. 23, 2020

(65) Prior Publication Data

US 2021/0010945 A1    Jan. 14, 2021

Related U.S. Application Data

(60) Provisional application No. 62/871,865, filed on Jul. 9, 2019.

(51) Int. Cl.
*G01N 21/88* (2006.01)
*G06T 7/00* (2017.01)

(52) U.S. Cl.
CPC ......... *G01N 21/8806* (2013.01); *G06T 7/001* (2013.01); *G06T 2207/30108* (2013.01)

(58) Field of Classification Search
CPC ............. G01N 21/8806; G06T 7/001; G06T 2207/30108
See application file for complete search history.

(56) References Cited

U.S. PATENT DOCUMENTS

| | | | |
|---|---|---|---|
| 7,570,796 B2 | 8/2009 | Zafar et al. | |
| 7,676,077 B2 | 3/2010 | Kulkarni et al. | |
| 8,126,255 B2 | 2/2012 | Bhaskar et al. | |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,222,895 B2 | 12/2015 | Duffy et al. | |
| 9,702,827 B1* | 7/2017 | Brauer | G01N 21/8851 |
| 9,865,512 B2 | 1/2018 | Jayaraman et al. | |

(Continued)

OTHER PUBLICATIONS

International Search Report and Written Opinion for PCT/US2020/039718 dated Oct. 15, 2020.

*Primary Examiner* — Md N Haque
(74) *Attorney, Agent, or Firm* — Ann Marie Mewherter

(57) ABSTRACT

Methods and systems for selecting defect detection methods for inspection of a specimen are provided. One system includes one or more computer subsystems configured for separating polygons in a care area into initial sub-groups based on a characteristic of the polygons on the specimen and determining a characteristic of noise in output generated by a detector of an inspection subsystem for the polygons in the different initial sub-groups. The computer subsystem(s) are also configured for determining final sub-groups for the polygons by combining any two or more of the different initial sub-groups having substantially the same values of the characteristic of the noise. In addition, the computer subsystem(s) are configured for selecting first and second defect detection methods for application to the output generated by the detector of the inspection subsystem during inspection of the specimen or another specimen.

23 Claims, 6 Drawing Sheets

(56) References Cited

U.S. PATENT DOCUMENTS

| | | | |
|---|---|---|---|
| 2007/0230770 A1* | 10/2007 | Kulkarni | G06T 7/33 382/149 |
| 2012/0216169 A1 | 8/2012 | Park et al. | |
| 2014/0376801 A1* | 12/2014 | Karsenti | G06T 7/001 382/145 |
| 2015/0199803 A1* | 7/2015 | Park | G06T 7/001 382/149 |
| 2016/0104600 A1* | 4/2016 | Luo | G05B 19/401 250/310 |
| 2016/0150191 A1* | 5/2016 | Karsenti | G06T 7/33 382/149 |
| 2016/0372303 A1* | 12/2016 | Park | G06K 9/6267 |
| 2017/0046471 A1 | 2/2017 | Xu et al. | |
| 2017/0059491 A1* | 3/2017 | Duffy | G01N 21/95607 |
| 2017/0200264 A1 | 7/2017 | Park et al. | |
| 2017/0206650 A1* | 7/2017 | Kulkarni | G06T 7/001 |
| 2018/0293721 A1 | 10/2018 | Gupta et al. | |
| 2019/0080447 A1* | 3/2019 | Shkalim | G06T 7/0006 |
| 2020/0126212 A1 | 4/2020 | Duffy et al. | |

* cited by examiner

Design image:

Projection onto horizontal axis:

SELECTING DEFECT DETECTION METHODS FOR INSPECTION OF A SPECIMEN

BACKGROUND OF THE INVENTION

1. Field of the Invention

The present invention generally relates to methods and systems for selecting defect detection methods for inspection of a specimen.

2. Description of the Related Art

The following description and examples are not admitted to be prior art by virtue of their inclusion in this section.

Inspection processes are used at various steps during a semiconductor manufacturing process to detect defects on reticles and wafers to promote higher yield in the manufacturing process and thus higher profits. inspection has always been an important part of fabricating semiconductor devices. However, as the dimensions of semiconductor devices decrease, inspection becomes even more important to the successful manufacture of acceptable semiconductor devices because smaller defects can cause the devices to fail.

"Care areas" as they are commonly referred to in the art are areas on a specimen that are of interest for inspection purposes. Sometimes, care areas are used to differentiate between areas on the specimen that are inspected from areas on the specimen that are not inspected in an inspection process. In addition, care areas are sometimes used to differentiate between areas on the specimen that are to be inspected with one or more different parameters. For example, if a first area of a specimen is more critical than a second area on the specimen, the first area may be inspected with a higher sensitivity than the second area so that defects are detected in the first area with a higher sensitivity. Other parameters of an inspection process can be altered from care area to care area in a similar manner.

Different categories of inspection care areas are currently used. One category is legacy care areas, which are traditionally hand drawn. With nearly all users adopting design guided inspection, very few legacy care areas are currently used. Another category is design based care areas. These are care areas derived based on heuristics on chip design patterns printed on the specimen. The user tries to look at the chip design and derive methods/scripts that will help derive care areas. There are multiple techniques and tools available to define these design based care areas. As they are derived from ground truth (chip design), they can provide high precision, substantially tiny care areas and also allow inspection systems to store high volumes of care areas. These care areas are important not just from a defect detection standpoint, but they are often crucial to noise suppression.

Some currently used inspection methods also use regular groups of care areas in which care areas of different noise behavior are grouped together and even one single care area can include many different structures of different noise behavior. In order to identify areas in which the noise is higher, several iterations of a so-called design-based search has to be performed over and over. This procedure takes a lot of time.

The currently used methods and systems for inspection involving care areas have, therefore, a number of disadvantages. For example, the time to results is substantially slow as several iterations of searching for noisy structures have to be performed. Sometimes, it is impossible to identify all the noisy structures manually due to complexity. In this case, the sensitivity used to inspect areas that are less noisy is compromised because areas that are more noisy are falling in the same care area group. This diminished inspection sensitivity can prevent the finding of key defects of interest (DOIs).

Accordingly, it would be advantageous to develop systems and methods for selecting defect detection methods for inspection of a specimen that do not have one or more of the disadvantages described above.

SUMMARY OF THE INVENTION

The following description of various embodiments is not to be construed in any way as limiting the subject matter of the appended claims.

One embodiment relates to a system configured for selecting defect detection methods for inspection of a specimen. The system incudes one or more computer subsystems configured for separating polygons in a care area on a specimen into initial sub-groups based on a characteristic of the polygons on the specimen such that the polygons having different values of the characteristic are separated into different initial sub-groups. The computer subsystem(s) are also configured for determining a characteristic of noise in output generated by a detector of an inspection subsystem for the polygons on the specimen in the different initial sub-groups. in addition, the computer subsystem(s) are configured for determining final sub-groups for the polygons by combining any two or more of the different initial sub-groups having substantially the same values of the characteristic of the noise into one of the final sub-groups. The computer subsystem(s) are further configured for selecting first and second defect detection methods for application to the output generated by the detector of the inspection subsystem during inspection of the specimen or another specimen of the same type for a first and a second of the final sub-groups, respectively, based on the characteristic of the noise determined for the first and second of the final sub-groups, respectively. The system may be further configured as described herein.

Another embodiment relates to a computer-implemented method for selecting defect detection methods for inspection of a specimen. The method includes the separating, determining a characteristic, determining final sub-groups, and selecting steps described above. The steps of the method are performed by one or more computer subsystems.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for selecting defect detection methods for inspection of a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
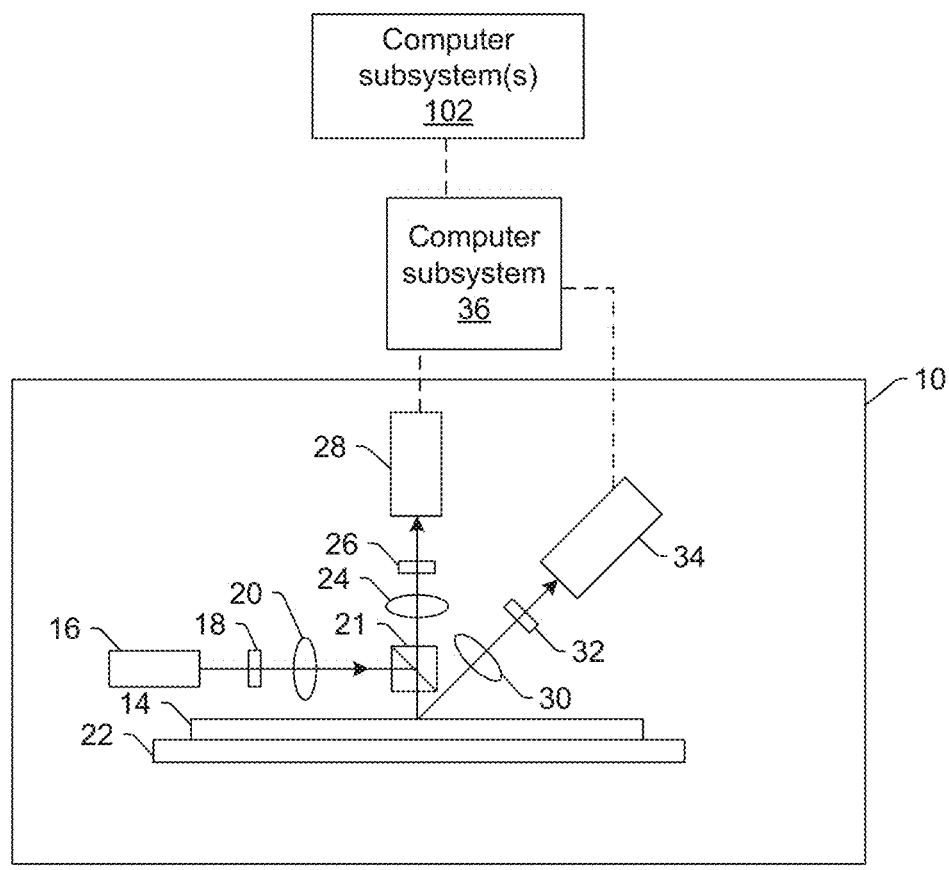
FIGS. 1 and 2 are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

"Nuisances" (which is sometimes used interchangeably with "nuisance defects") as that term is used herein is generally defined as defects that a user does not care about and/or events that are detected on a specimen but are not really actual defects on the specimen. Nuisances that are not actually defects may be detected as events due to non-defect noise sources on a specimen (e.g., grain in metal lines on the specimen, signals from underlaying layers or materials on the specimen, line edge roughness (LER), relatively small critical dimension (CD) variation in patterned attributes, thickness variations, etc.) and/or due to marginalities in the inspection system itself or its configuration used for inspection.

The term "defects of interest (DOIs)" as used herein is defined as defects that are detected on a specimen and are really actual defects on the specimen. Therefore, the DOIs are of interest to a user because users generally care about how many and what kind of actual defects are on specimens being inspected. In some contexts, the term "DOI" is used to refer to a subset of all of the actual defects on the specimen, which includes only the actual defects that a user cares about. For example, there may be multiple types of DOIs on any given specimen, and one or more of them may be of greater interest to a user than one or more other types. In the context of the embodiments described herein, however, the term "DOIs" is used to refer to any and all real defects on a specimen.

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design data. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers.

The "design" or "physical design" may also be the design as it would be ideally formed on the wafer. In this manner, a design may not include features of the design that would not be printed on the wafer such as optical proximity correction (OPC) features, which are added to the design to enhance printing of the features on the wafer without actually being printed themselves.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured for selecting defect detection methods for inspection of a specimen. Some embodiments are related to statistical care area grouping for enhanced defect inspection sensitivity. For example, the care area sub-division and statistical re-grouping in defect inspection described herein can be used to enhance sensitivity to DOIs, to lower nuisance rate, to improve within wafer and wafer-to-wafer recipe performance stability, or some combination thereof.

In one embodiment, the specimen is a wafer. The wafer may include any wafer known in the semiconductor arts. In another embodiment, the specimen is a reticle. The reticle may include any reticle known in the semiconductor arts. Although some embodiments may be described herein with respect to a wafer or wafers, the embodiments are not limited in the specimen for which they can be used. For example, the embodiments described herein may be used for specimens such as reticles, flat panels, personal computer (PC) boards, and other semiconductor specimens.

One embodiment of such a system is shown in FIG. 1. In some embodiments, the system includes an inspection subsystem that includes at least an energy source and a detector. The energy source is configured to generate energy that is directed to a specimen. The detector is configured to detect energy from the specimen and to generate output responsive to the detected energy.

In one embodiment, the inspection subsystem is a light-based inspection subsystem. For example, in the embodiment of the system shown in FIG. 1, inspection subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different angle of incidence.

In some instances, the inspection subsystem may be configured to direct light to the specimen at more than one angle of incidence at the same time. For example, the inspection subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser, which may be any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more elements of the illumination subsystem based on the type of illumination to be used for inspection.

The inspection subsystem may also include a scanning subsystem configured to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be scanned over the specimen. In addition, or alternatively, the inspection subsystem may be configured such that one or more optical elements of the inspection subsystem perform some scanning of the light over the specimen. The light may be scanned over the specimen in any suitable fashion.

The inspection subsystem further includes one or more detection channels. At least one of the one or more detection channels includes a detector configured to detect light from the specimen due to illumination of the specimen by the inspection subsystem and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the inspection subsystem that includes two detection channels, the inspection subsystem may include a different number of detection channels (e.g., only one detection channel or two or more detection channels). Although each of the collectors are shown in FIG. 1 as single refractive optical elements, each of the collectors may include one or more refractive optical element(s) and/or one or more reflective optical element(s).

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate images in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 29xx and 39xx series of tools that are commercially available from KLA. For some such systems, the embodiments described herein may be provided as optional functionality of the inspection system (e.g., in addition to other functionality of the inspection system). Alternatively, the inspection subsystem described herein may be designed "from scratch" to provide a completely new inspection system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the inspection subsystem is described above as being an optical or light-based subsystem, the inspection subsystem may be an electron-based subsystem. For example, in one embodiment, the energy directed to the specimen includes electrons, and the energy detected from the specimen includes electrons. In this manner, the energy source may be an electron beam source. In one such embodiment shown in FIG. 2, the inspection subsystem includes electron column 122, which is coupled to computer subsystem 124.

Figure 2:
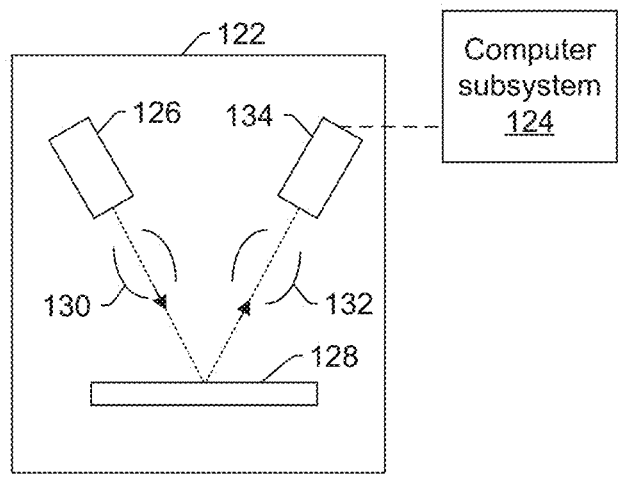

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam subsystem may be configured to use multiple modes to generate images of the specimen (e.g., with different illumination angles, collection angles, etc). The multiple modes of the electron beam subsystem may be different in any image generation parameter(s) of the subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the inspection subsystem shown in FIG. 2 may be further configured as described herein.

It is noted that FIG. 2 is provided herein to generally illustrate a configuration of an electron-based inspection subsystem that may be included in the embodiments described herein. As with the optical subsystem described above, the electron beam subsystem configuration described herein may be altered to optimize the performance of the subsystem as is normally performed when designing a commercial inspection system. In addition, the systems described herein may be implemented using an existing inspection system (e.g., by adding functionality described herein to an existing inspection system). For some such systems, the embodiments described herein may be provided as optional functionality of the system (e.g., in addition to other functionality of the system) Alternatively, the system described herein may be designed "from scratch" to provide a completely new system.

Although the inspection subsystem is described above as being a light-based or electron beam-based subsystem, the inspection subsystem may be an ion beam-based subsystem. Such an inspection subsystem may be configured as shown in FIG. 2 except that the electron beam source may be replaced with any suitable ion beam source known in the art. In one embodiment, therefore, the energy directed to the specimen includes ions. In addition, the inspection subsystem may be any other suitable ion beam-based inspection subsystem such as those included in commercially available focused ion beam (FIB) systems, helium ion microscopy (HIM) systems, and secondary ion mass spectroscopy (SIMS) systems.

The inspection subsystems described herein may be configured to generate output, e.g., images, of the specimen with multiple modes. In general, a "mode" is defined by the values of parameters of the inspection subsystem used for generating output and/or images of a specimen (or the output used to generate images of the specimen). Therefore, modes may be different in the values for at least one of the parameters of the inspection subsystem (other than position on the specimen at which the output is generated). For example, in an optical subsystem, different modes may use different wavelength(s) of light for illumination. The modes may be different in the illumination wavelength(s) as described further herein (e.g., by using different light sources, different spectral filters, etc. for different modes). In another example, different modes may use different illumination channels of the optical subsystem. For example, as noted above, the optical subsystem may include more than one illumination channel. As such, different illumination channels may be used for different modes. The modes may also or alternatively be different in one or more collection/detection parameters of the optical subsystem. The modes may be different in any one or more alterable parameters (e.g., illumination polarization(s), angle(s), wavelength(s), etc., detection polarization(s), angle(s), wavelength(s), etc.) of the inspection subsystem. The inspection subsystem may be configured to scan the specimen with the different modes in the same scan or different scans, e.g., depending on the capability of using multiple modes to scan the specimen at the same time.

In a similar manner, the output generated by the electron beam subsystem may include output, e.g., images, generated by the electron beam subsystem with two or more different values of a parameter of the electron beam subsystem. The multiple modes of the electron beam subsystem can be defined by the values of parameters of the electron beam subsystem used for generating output and/or images for a specimen. Therefore, modes may be different in the values for at least one of the electron beam parameters of the electron beam subsystem. For example, different modes may use different angles of incidence for illumination.

The subsystems described herein and shown in FIGS. 1 and 2 may be modified in one or more parameters to provide different output generation capability depending on the application for which they will be used. In one such example, the inspection subsystem shown in FIG. 1 may be configured to have a higher resolution if it is to be used for defect review or metrology rather than for inspection. In other words, the embodiments of the inspection subsystems shown in FIGS. 1 and 2 describe some general and various configurations for an inspection subsystem that can be tailored in a number of manners that will be obvious to one skilled in the art to produce inspection subsystems having different output generation capabilities that are more or less suitable for different applications.

As noted above, the optical, electron, and ion beam subsystems are configured for scanning energy (e.g., light, electrons, etc.) over a physical version of the specimen thereby generating output for the physical version of the specimen. In this manner, the optical, electron, and ion beam subsystems may be configured as "actual" subsystems, rather than "virtual" subsystems. However, a storage medium (not shown) and computer subsystem(s) 102. shown in FIG. 1 may be configured as a "virtual" system. In particular, the storage medium and the computer subsystem(s) may be configured as a "virtual" inspection system as described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

Figure 3:
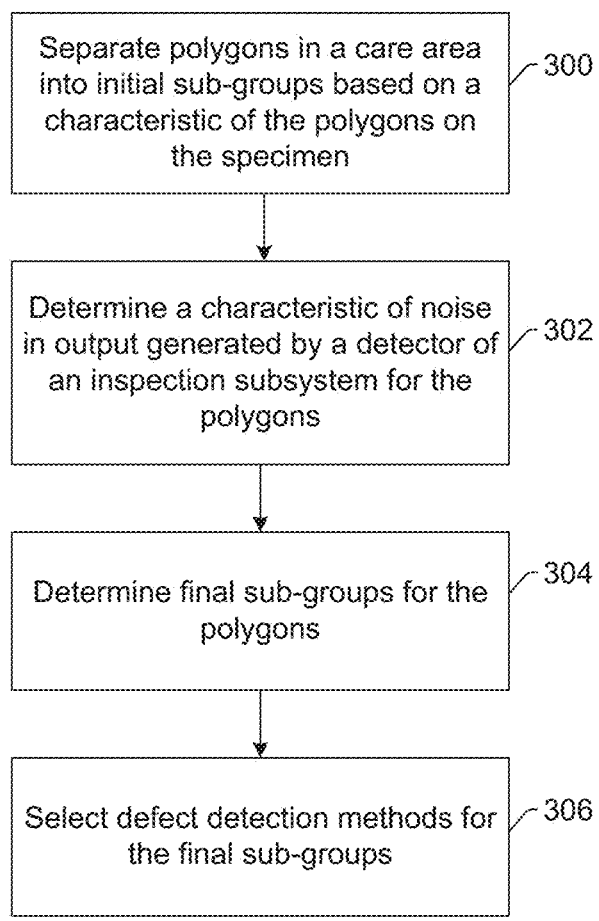
FIG. 3 is a flow chart illustrating an embodiment of steps performed by the one or more computer subsystems described herein.

The one or more computer subsystems are configured for separating polygons in a care area on a specimen into initial sub-groups based on a characteristic of the polygons on the specimen such that the polygons having different values of the characteristic are separated into different initial sub-groups. For example, as shown in step 300 of FIG. 3, the computer subsystem(s) may be configured for separating polygons in a care area into initial sub-groups based on a characteristic of the polygons on the specimen. Several examples of polygon characteristics that can be used for this step are described further herein. How different values of these characteristics are defined may vary in a number of ways. For example, some characteristics are qualitative rather than quantitative, e.g., a square shape is different than a line shape, which are both different than an irregular polygon shape. However, many characteristics may be quantitatively different, e.g., orientation differences described in degrees, dimensions described in nm, areas described in $nm^2$, etc. Therefore, whether two values of a characteristic are determined to be different in the separating step may be based on a predetermined range of values that define different values versus not different values. The predetermined range of differences between the values may be determined in any suitable manner, e.g., a predetermined range may be set by a user, a predetermined range may be determined statistically based on how much two values have to be different for them to be considered statistically different, a predetermined range based on a priori knowledge of how different two polygons have to be to produce statistically different values of noise or how similar two polygons have to be to produce statistically similar values of noise, etc.

Although the embodiments are described herein with respect to a characteristic of the polygons, the separating step may be performed based on one or more characteristics of the polygons such as shape, orientation, dimension, etc. Some of the polygons may be separated based on values for one characteristic (e.g., shape), while other polygons may be separated based on a different characteristic (e.g., orientation). In one embodiment, the characteristic of the polygons includes a physical characteristic of the polygons. In another embodiment, the separating is performed by projecting the polygons along one axis. For example, the polygons in care areas may be divided into initial sub-groups based on design polygon dimensions such as polygon area, x dimension, and y dimension, polygon orientation, polygon shape, projection value in x direction or y direction, and care area dimensions. In this manner, the initial sub-grouping of the polygons in a care area may be performed according to dimensions/shapes/orientations of the design polygons and/or projection based groups.

Figure 4:
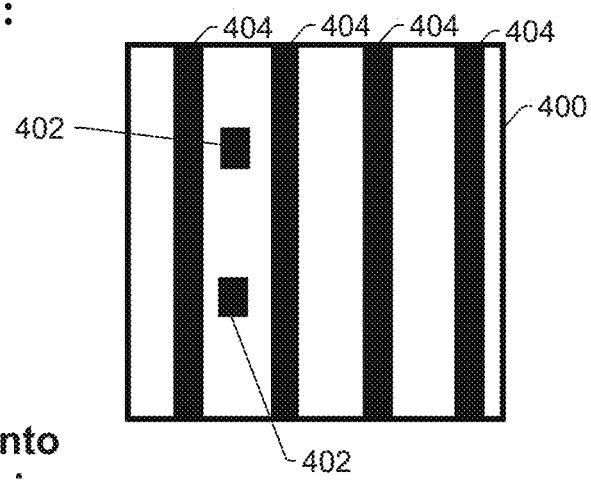
FIG. 4 is a schematic diagram illustrating a plan view of one example of a care area on a specimen and a chart showing results of a projection performed for polygons in the care area.
Figure 4:
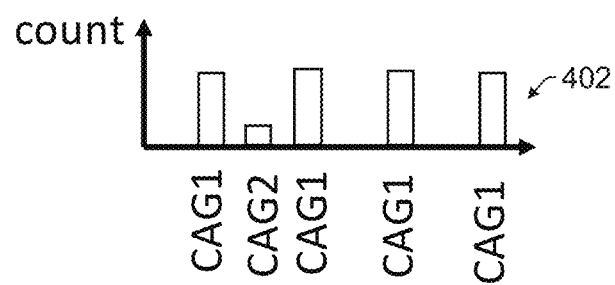

One example of projection based analysis of polygons in a care area is shown in FIG. 4. FIG. 4 shows a design image for care area 400. The design image shows the polygons in the design for the care area. Determining a characteristic of the polygons in this care area may include projection along the y direction, which may produce projection 402 showing the number of polygons as a function of position along the x axis. Polygons having the same or similar counts may then be assigned to the same care area initial sub-group. In other words, all design polygons that are located in an area of high projection based count are affiliated with care area initial sub-group 1 (CAG1) and the others with care area initial sub-group 2 (CAG2). Therefore, based on the projection shown in FIG. 4, polygons 404 in care area 400 will be separated into CAG1 and polygons 402 in care area 400 will be separated into CAG2. Projection based separation of the polygons may be particularly suitable when a care area includes mostly line and space patterns with some other polygons in between.

Figure 5:
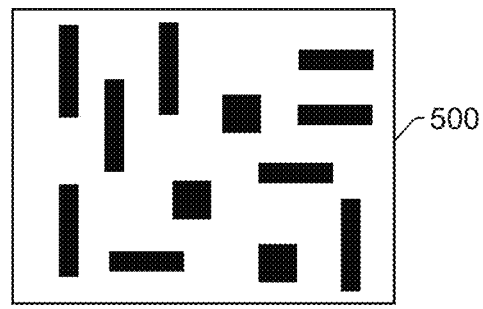
FIG. 5 is a schematic diagram illustrating a plan view of one example of a care area on a specimen.

FIG. 5 shows another example of care area 500 for a specimen such as a wafer. As shown in FIG. 5, the care area includes multiple polygons having different characteristics. In particular, some of the polygons are line-like structures that extend in the x direction, others of the polygons are line-like structures that extend in the y direction, and some additional polygons are square-like structures. Although FIG. 5 (and other figures described herein) shows an example of a care area that includes polygons in particular numbers and having particular characteristics, it is to be understood that the embodiments described herein are not limited to any particular care areas and/or polygons having any particular characteristics (size, shape, location, etc.) for which the steps described herein can be performed. In addition, although the embodiments are described herein with respect to a care area (of which there may be multiple instances formed on a specimen), the embodiments described herein may also be separately and independently performed for multiple care areas on a specimen.

Figure 7:
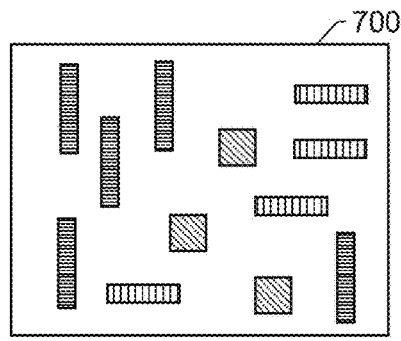
FIG. 7 is a schematic diagram illustrating a plan view of the care area shown in FIG. 5 with the polygons in the care area separated into initial sub-groups based on a characteristic of the polygons.

The polygons in the care area shown in FIG. 5 may be separated into different initial sub-groups as described further herein. For example, FIG. 7 shows version 700 of the care area of FIG. 5 with polygons having different characteristics shown with different fill patterns. In particular, the line-like structures that extend in the y direction are shown with horizontal line fill patterns, the line-like structures that extend in the x direction are shown with vertical line fill patterns, and the square-like structures are shown with diagonal line fill patterns. Each of the polygons shown in FIG. 7 having the same fill pattern, therefore, belongs in the same initial sub-group. In other words, the line-like structures that extend in the y direction may all be separated into a first initial sub-group, the line-like structures that extend in the x direction may all be separated into a second initial sub-group, and the square-like structures may all be separated into a third initial sub-group. In this manner, the polygons shown in the care area of FIG. 5 may be separated based on their shape, size, orientation, etc. into initial sub-groups.

In some embodiments, the polygons in the care area include polygons on more than one layer of the specimen. For example, the polygons are not limited to one single layer of polygons but can be extended to multiple layers containing polygons. The more than one layer may include the layer that will be inspected and a layer below the layer that will be inspected on the specimen. Therefore, the layer below the inspected layer may not necessarily be of interest in the inspection, but that underlying layer and/or polygons formed thereon may affect the output generated for the specimen during the inspection. For example, the underlying polygons may affect the noise in the output generated by an inspection subsystem for a specimen. Therefore, such polygons may be taken into account by the embodiments described herein since two of the same polygons on the same inspected layer may have substantially different noise characteristics in inspection due to different underlying polygons. In this manner, the initial sub-groups may be defined so that polygons on the inspected layer having different values of the characteristic are separated into different initial sub-groups and so that polygons on the inspected layer having the same values of the characteristic but are located above one or more polygons having different values of a characteristic of the polygon(s) are separated into different initial sub-groups. In one such example, the line-like structures that extend in the x direction shown in FIG. 5 may be separated into an initial sub-group as shown in FIG. 7, then the polygons in that initial sub-group may be further separated into subgroups based on which polygons (not shown) the line-like structures are formed above. Information about the polygons on more than one layer of the specimen may be acquired as described herein from a design for the specimen. Defining the care area initial sub-groups can then be performed for each layer independently or can be a combination especially when the design polygons of different layers are overlapping.

The creation of the care area initial and final sub-groups is also not limited to splitting original care areas but entirely new care areas can be created based on the design polygons and the characteristic of the noise as described herein, respectively. For example, although for simplicity, the design polygons in the care area and the design polygons in the various sub-groups are the same in the examples shown herein, this does not have to be the case as the care areas may be grown or shrunk depending on the results of the steps described herein. In other words, a care area may be expanded from its original definition to encompass other nearby polygons having the same values of the characteristic of the polygons and substantially the same values of the characteristic of the noise as polygons in the originally defined care area. In a similar manner, a care area may be shrunk from its original definition to eliminate one or more polygons from the original definition, which may be moved to another care area or may be removed from all care areas entirely based on the initial sub-grouping and final sub-grouping steps described herein. Such expansion, shrinking, or other modification to the perimeter defining a care area may be performed based on only the polygons on the inspected layer or based on polygons on more than one layer of the specimen.

In another embodiment, the one or more computer subsystems are further configured for determining the characteristic of the polygons on the specimen from a design for the specimen. For example, the separating step may include dividing care area groups into initial sub-groups by using a design-based pattern search. In one such example, logic rules based on IC design, e.g., pattern density, line distance, etc., may be used to determine the characteristic of the polygons and to separate polygons having different characteristics from each other. The design-based pattern search may be performed in any suitable manner by the embodiments described herein or by using another system or method such as an electronic design automation (EDA) tool, which may include any commercially available EDA tool known in the art.

In an additional embodiment, the one or more computer subsystems are further configured for determining the characteristic of the polygons on the specimen by rendering a design for the specimen. For example, the separating step may include a design rendering based approach in which the design for the specimen is used to simulate characteristics of the polygons as they will be formed on the specimen. In particular, the characteristics of the polygons as they are designed may be different from the characteristics of the polygons as they are formed on the specimen. In addition, since it is the characteristics of the polygons as formed on the specimen, not necessarily as they are designed, that will affect the characteristics of the noise in inspection system output, the characteristics of the polygons as they will be formed on the specimen may be more suitable than their as-designed characteristics for separating the polygons into initial sub-groups.

Rendering the design may include simulating what the design would look like when printed or fabricated on a specimen. For example, rendering the design may include generating a simulated representation of a specimen on which the polygons are printed or formed. One example of an empirically trained process model that may be used to generate a simulated specimen includes SEMulator 3D, which is commercially available from Coventor, Inc., Cary, N.C. An example of a rigorous lithography simulation model is Prolith, which is commercially available from KLA, and which can be used in concert with the SEMulator 3D product. However, rendering the design for the specimen may be performed to generate a simulated specimen using any suitable model(s) of any of the process(es) involved in producing actual specimens from the design. In this manner, the design may be used to simulate what a specimen on which the design has been formed will look like in specimen space (not necessarily what such a specimen would look like to an imaging system). Therefore, the design rendering may generate a simulated representation of the specimen that may represent what the specimen would look like in two-dimensional (2D) or three-dimensional (3D) space of the specimen.

The computer subsystem(s) are also configured for determining a characteristic of noise in output generated by a detector of an inspection subsystem for the polygons on the specimen in the different initial sub-groups. For example, as shown in step 302 of FIG. 3, the computer subsystem(s) may be configured for determining a characteristic of noise in output generated by a detector of an inspection subsystem for the polygons. The output generated by the detector may include any of the output described herein, e.g., image signals, image data, non-image signals, non-image data, etc. The characteristic of the noise may be determined in a number of different ways described herein.

Figure 6:
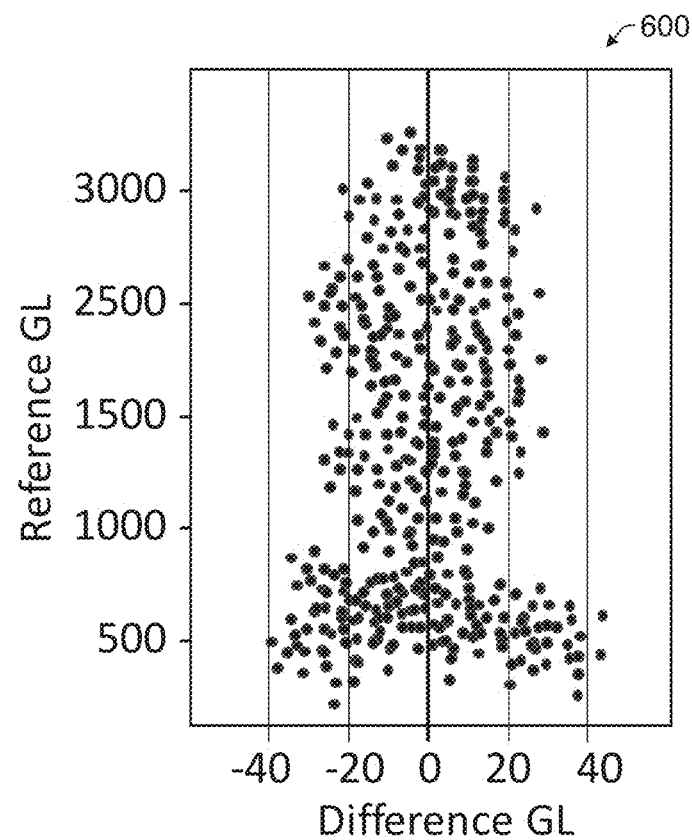
FIG. 6 is an example of a two-dimensional histogram generated from different values determined from output generated by a detector of an inspection subsystem for the polygons in the care area shown in FIG. 5.
Figure 8:
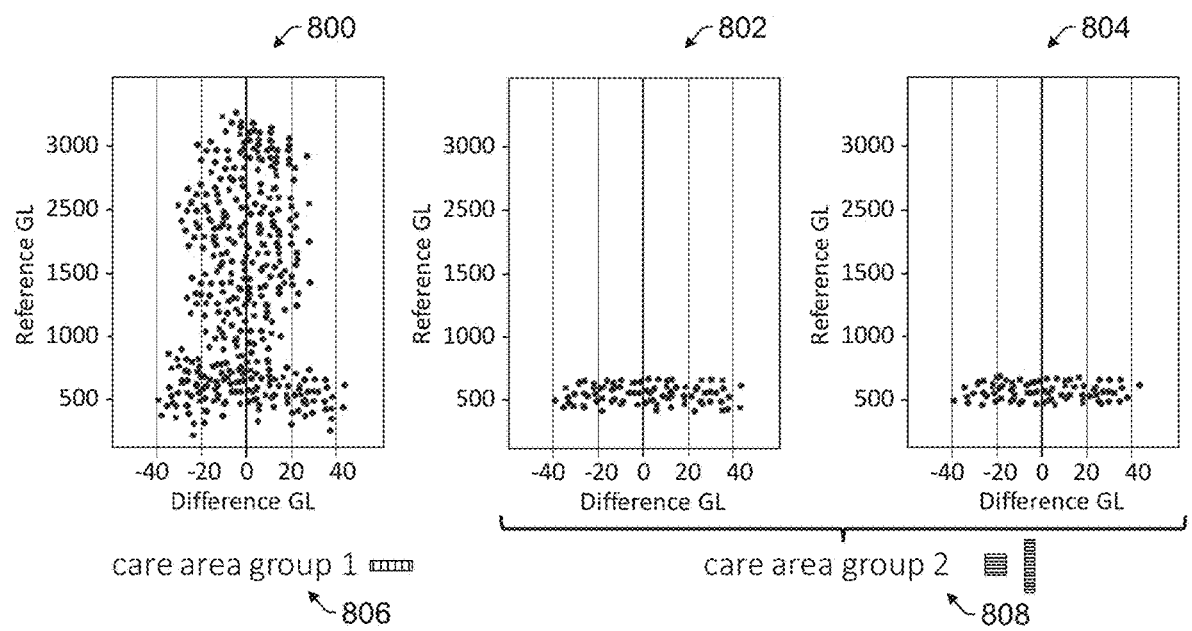
FIG. 8 includes examples of two-dimensional histograms generated from different values determined from output generated by a detector of an inspection subsystem for the initial sub-groups of polygons shown in FIG. 7 and differences in the two-dimensional histograms.

In some instances, the characteristic of the noise for the entire care area can be substantially different from the characteristic of the noise for different initial sub-groups of polygons within the care area, which can also be substantially different from each other. FIGS. 6 and 8 illustrate such differences and show 2D histograms derived from a wafer-based difference image of the structures within the care area derived from the design polygons shown in FIGS. 5 and 7, respectively. The axes on the 2D histograms shown in these figures are the reference grey level and the difference grey level. In FIG. 6, the reference grey levels and difference grey levels for all of the polygons in the care area of FIG. 5 have been combined together. 2D histogram 600 shown in FIG. 6 is, therefore, of the original care area group (reference grey level over difference grey level). At least one of the initial sub-groups of polygons is substantially noisy, which is shown in 2D histogram 600 by the substantially large dynamic range and substantially high noise level (where the "dynamic range" used in this context is defined as the maximum-minimum grey level in a reference image frame). The dynamic range may be particularly useful for the characteristic of the noise in the embodiments described herein since it is usually correlated to the types of polygons in the area for which the 2D histogram is generated (e.g., a care area that includes different types of polygons, at least some of which have a different characteristic on the specimen, will generally have a higher dynamic range in such a 2D histogram compared to a care area that includes only one type of polygons, all of which have substantially similar characteristics on the specimen). For example, if there are lots of different patterns in a reference image frame, i.e., a mix of patterns of different grey levels, then the 2D histogram may show a relatively high dynamic range.

As described above, after all of the individual polygons in the care area shown in FIG. 5 are identified, each of the polygon shapes are grouped into one of three initial sub-groups as shown in FIG. 7. Individual histograms may then be generated for each of the initial sub-groups. The individual histograms may be generated from the same data that was used to generate histogram 600, e.g., by separating the data based on where in the care area it was generated and where in the care areas the polygons are located, the data can be separated for different initial sub-groups of polygons. For example, as shown in FIG. 8, 2D histogram 800 may be generated for the line-like structures extending in the x direction, 2D histogram 802 may be generated for the square-like structures, and 2D histogram 804 may be generated for the line-like structures extending in the y direction. As can be seen from FIG. 8, by evaluating the individual 2D histograms for the initial sub-groups, 2D histograms 802 and 804 show that the initial sub-groups for the square-like polygons and the line-like polygons extending in the y direction are relatively quiet (e.g., have substantially low noise values in a relatively small dynamic range) with similar noise characteristics (e.g., substantially similar noise distributions across substantially similar values of the noise) whereas 2D histogram 800 for the line-like polygons extending in the x direction is substantially noisy (e.g., has a relatively large dynamic range) with substantially different noise characteristics than the other 2D histograms (e.g., the noise distribution in 2D histogram 800 is substantially different than those in 2D histograms 802 and 804). These histograms may then be used to determine the final sub-groups of the polygons as described further herein.

In one embodiment, the output generated by the detector of the inspection subsystem used for determining the characteristic of the noise is generated by scanning the specimen with the inspection subsystem. For example, using all of the care area initial sub-groups, a wafer inspection run may be performed. The one or more computer subsystems may therefore be configured for acquiring the output used for determining the noise characteristic by using one of the inspection subsystems described herein (e.g., by directing light or an electron beam to the specimen and detecting light or an electron beam from the specimen). In this manner, acquiring the output may be performed using the physical specimen itself and some sort of inspection (e.g., imaging) hardware. However, acquiring the output does not necessarily include imaging or scanning the specimen using imaging hardware. For example, another system and/or method may generate the output and may store the generated output in one or more storage media such as a virtual inspection system as described herein or another storage media described herein. Therefore, acquiring the output may include acquiring the output from the storage media in which it has been stored.

In some embodiments, the output used for determining the characteristic of the noise is output generated with more than one mode of the inspection subsystem for the specimen. For example, multimodal noise information may be used for the step(s) described further herein. Using multimodal noise may be beneficial when selecting defect detection methods for multi-mode inspection. The multiple modes of the inspection subsystem may include any of the modes described further herein. In some instances, different noise characteristics may be determined from the output generated in different modes. For example, different modes may be used for the same inspection of a specimen, and the embodiments described herein may be configured to perform the steps separately for more than one mode, e.g., such that different final sub-groups are determined for different modes, for which different defect detection methods may then be selected as described herein. In this manner, when the modes are known, the steps described herein may be performed for each of the modes separately and independently, and the output of the detector(s) used for those steps may be generated in the same scan of the specimen or in multiple scans of the specimen, e.g., when the modes cannot simultaneously be used to generate output for the specimen.

The steps described herein may also be performed for more than one mode for mode selection. For example, the steps described herein can be used to evaluate different modes by performing the steps described herein for different modes and then determining which mode or modes would be most suitable for inspection of a specimen, e.g., by comparing the final sub-groups determined for different modes and the defect detection methods selected for the final sub-groups in the different modes, the mode or mode combination that can detect the most DOIs, suppress the most nuisances, etc. can be identified and selected for use in the inspection of the specimen or other specimens of the same type. In this manner, the embodiments described herein can be used for simultaneous selection of both mode(s) and algorithm(s). In addition, as described further herein, parameter(s) of the detect detection methods that are selected can be independently tuned thereby enabling optimization of the inspection for each final sub-group and mode combination. Any other parameter(s) of the inspection subsystem and/or inspection recipe can also be independently selected for each mode/final sub-group/defect detection method combination, e.g., nuisance filtering parameters, defect classification parameters, etc., by the embodiments described herein. Such other parameters may be selected in any suitable manner known in the art.

In another embodiment, determining the characteristic of the noise includes performing statistical analysis of the output. For example, the noise may be measured, and a statistical analysis may be performed calculating the characteristics such as the standard deviation of the difference grey level or the dynamic range. In addition, determining the characteristic of the noise may include performing a statistical analysis of the noise distribution of every individual care area initial sub-group, e.g., setting the offset of 0 at $\mu+/-3\sigma$ for the difference grey level, wherein $\mu$ is the mean and $\sigma$ is the standard deviation. The characteristic of the noise may also or alternatively be a characteristic of the noise relative to non-noise signals or image data. For example, the characteristic of the noise that is determined by the embodiments described herein may be a kind of collective signal-to-noise ratio that describes a characteristic of the noise relative to a characteristic of non-noise. For example, the characteristic of the noise may include or be determined based on the noise and/or outlier (potential defect signals or images) distribution characteristics.

In some embodiments, determining the characteristic of the noise includes determining the characteristic of the noise in the output generated by the detector of the inspection subsystem for the polygons on the specimen in combination with output generated by the detector of the inspection subsystem for the polygons in the different initial sub-groups on another specimen. For example, the grouping for the final sub-groups can be performed by collecting data on several (two or more) wafers. This way noisy and non-noisy care areas and polygons can be identified with respect to wafer-to-wafer process variation. In addition, care area groups/sub-groups with relatively high wafer-to-wafer variation can be identified and grouped accordingly. How many specimens are scanned to generate the output used for determining the characteristic of the noise and determining the final sub-groups may also be determined dynamically. For example, if two specimens are scanned, and the same polygons on different specimens show substantially high variation in the noise characteristic from specimen-to-specimen, then one or more additional specimens may be scanned to further characterize the noise exhibited by those polygons from specimen-to-specimen. Otherwise, the number of specimens that are scanned may be determined in any suitable manner known in the art.

In an additional embodiment, determining the characteristic of the noise includes determining the characteristic of the noise in the output generated by the detector of the inspection subsystem for the polygons on the specimen in the different initial sub-groups in more than one instance of the care area on the specimen. For example, although the embodiments are described herein with respect to a care area and they may be performed using output generated for a single care area instance, in general, the output that is used to determine the characteristic of the noise may be generated from more than one instance of the care area on at least one specimen. The multiple instances of the care area may be formed in the same reticle instance, e.g., die, field, etc., on the specimen and/or in more than one reticle instance on the specimen. In addition, the distribution of the care area instances across the specimen used for determining the characteristic of the noise may be determined based on, for example, expected process variations across the specimen which can affect the inspection subsystem output, the area on the specimen that will be scanned during an inspection run, etc. Furthermore, although it may be advantageous to generate output from many (many more than two) care area instances for determining the noise characteristic, generating output from all of the care area instances on the specimen may not be necessary to fairly characterize the noise from the polygons in the specimen. Regardless of how the scanning or output generation is performed, the output that is generated for the polygons in the initial sub-groups can be identified in any suitable manner, e.g., based on the known positions of the polygons in the care area, the known or estimated positions of the care area instances on the specimen, and the known positions at which the various output is generated on the specimen. Therefore, the output that is generated for different polygons can be separated and used to determine the characteristic of the noise as described herein.

The computer subsystem(s) are configured for determining final sub-groups for the polygons by combining any two or more of the different initial sub-groups having substantially the same values of the characteristic of the noise into one of the final sub-groups. For example, as shown in step 304 of FIG. 3, the computer subsystem(s) may determine final sub-groups for the polygons. Depending on the characteristic of the noise, care area initial sub-groups may be combined. "Substantially the same" values, as that term is used herein, may be used interchangeably with the terms "insignificantly different" and "statistically similar" values. The term "statistically similar" values, as used herein, is intended to have the commonly accepted definition of the term used in the art of mathematics and in particular statistics, i.e., statistically similar is commonly accepted to μ "within the margin of error" and "not caused by something other than chance." Both of these definitions are consistent with the use of the term herein. Whether or not values of the noise characteristic are "statistically similar" can be determined, for example, by comparing the differences in the values to the margin of error and determining that differences within the margin of error are "statistically similar."

In one such example, care area initial sub-groups with similar dynamic range values, die-to-die (difference) grey level variation, etc. may be combined into one care area final sub-group. In FIG. 8, for example, since 2D histogram 800 generated for the sub-group of the line-like polygons extending in the x direction is substantially different than 2D histograms 802 and 804 generated for the square-like polygons and the line-like polygons extending in the y direction, respectively, separating the line-like polygons extending in the x direction from the other polygons in the care area seems very promising since one could lower the thresholds (vertical lines in the plots) for the other polygons to detect DOIs which are located at the center part of the noise distribution. In addition, since 2D histograms 802 and 804 generated for the square-like polygons and the line-like polygons extending in the y direction, respectively, show that these polygons have substantially the same noise characteristics, these polygons may be combined into one final sub-group. In this manner, determining the final sub-groups may include combining initial sub-groups determined to have substantially the same noise behavior into a final sub-group. The much noisier initial sub-group that includes the line-like structures extending in the x direction will therefore not be combined with the other polygon initial sub-groups and will instead be included in its own separate final sub-group.

In this manner, as shown in FIG. 8, since 2D histogram 800 generated for initial sub-group A that includes line-like structures extending in the x direction is substantially different than the 2D histograms generated for other initial sub-groups, the line-line structures extending in the x direction may be included in one final sub-group, care area group 1 indicated in FIG. 8 by reference numeral 806. In addition, since 2D histogram 802 generated for initial sub-group B that includes square-like structures shows noise characteristics that are substantially the same as 2D histogram 804 generated for initial sub-group C that includes line-like structures that extend in the y direction, these initial sub-groups may be combined into one final sub-group, care area group 2 indicated in FIG. 8 by reference numeral 808.

Figure 9:
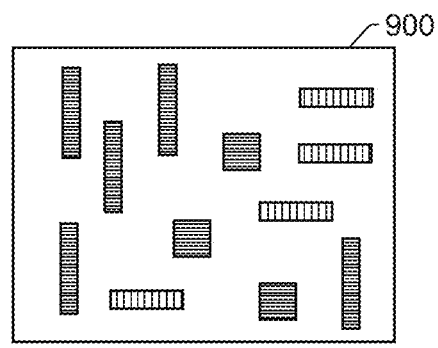
FIG. 9 is a schematic diagram illustrating a plan view of the care area shown in FIG. 5 with the polygons in the care area separated into final sub-groups based on the similarities and differences in the two-dimensional histograms shown in FIG. 8.

These final sub-groups are also shown in FIG. 9 in which the pattern fills for polygons in the same final sub-group are the same. In particular, as shown in FIG. 9, since the square-like polygons and the line-like polygons extending in the y direction are combined into a final sub-group, both of these polygons may be indicated with the same pattern fill, the horizontal lines shown in FIG. 9. In addition, since the line-like structures extending in the x direction are included in their own final sub-group, these polygons are shown in FIG. 9 with a different pattern fill than all of the other polygon types in care area version 900, the vertical lines.

In one embodiment, determining the characteristic of the noise and determining the final sub-groups are implemented as a noise scan functionality on the one or more computer subsystems and the inspection subsystem. In one such embodiment, the one or more computer subsystems and the inspection subsystem are configured for implementing the noise scan by collecting image frame data in the output generated by the detector of the inspection subsystem and calculating difference image frames according to a predetermined algorithm. In another such embodiment, the predetermined algorithm is the same as a predetermined algorithm used by at least one of multiple defect detection methods suitable for the inspection of the specimen or the another specimen from which the first and second defect detection methods are selected.

In this manner, the above-described determining a characteristic of noise and determining final sub-groups steps may be implemented as a "noise scan" functionality on the computer subsystem(s) and/or an inspection subsystem in which the two steps are performed in concert with one another. In other words, if a user selects a "noise scan" option on the embodiments described herein, both the determining a characteristic of noise and determining final sub-groups steps may be performed by the embodiments described herein. Collectively, then, these steps may include collecting image frame data and calculating difference image frames according to a certain algorithm (whether that is by die-to-die subtraction, cell-to-cell subtraction, test image to standard reference image subtraction, etc.). As such, the noise scan can be performed using a defect detection algorithm of choice. Ideally, the same defect inspection algorithm that was selected for the noise scan will also be used for the actual defect detection (although that is not necessarily required). The way the correct defect detection algorithm is selected may be based on the requirements of the inspection, e.g., some wafer setup makes it necessary to use SRD (described further herein) while others, due to severe process variation, may require MCAT+ (also described further herein), and so on. In addition, the user may decide which type of algorithm to use in the noise scan or the defect detection and in some instances one of the algorithms, e.g., MCAT (described further herein), may be selected as a default. This difference image frame will then be overlapped with sub-divided care area initial sub-groups to identify the correct final sub-grouping given their individual noise behavior.

The noise scan may also perform care area grouping using an algorithm that minimizes systematic noise. For example, by organizing initial sub-groups of polygons into final sub-groups based on similarities and differences between the noise behavior of the initial sub-groups of polygons, the embodiments described herein can minimize systematic noise within the final sub-groups of polygons that are used for defect detection. Using the final sub-groups as the care areas for inspection, therefore, provides significant advantages since as described further herein, defect detection performed for different final sub-groups may be different and may be tailored to each of the final sub-groups and their noise behavior.

The embodiments described herein are not just limited to combining initial sub-groups to determine the final sub-groups although that may be more common. Determining the final sub-groups may in some instances include separating polygons in an initial sub-group into different final sub-groups. For example, different instances of identical polygons may exhibit different noise behavior, e.g., depending on the polygons in the neighborhood of a polygon instance, the polygons underneath a polygon instance, where on a specimen a polygon instance is located (e.g., relative to an edge or a center of the specimen), etc. Therefore, in an optional scenario, the computer subsystem(s) described herein may be configured to analyze the noise characteristics of the initial sub-groups to identify initial sub-group(s) having substantially different noise characteristics from polygon instance to polygon instance.

In one such example, the computer subsystem(s) may compare noise characteristics determined for initial sub-groups such as dynamic range to a predetermined threshold and determine that any initial sub-groups having a dynamic range in excess of the predetermined threshold should be evaluated for separation. The computer subsystem(s) may then separate the polygon instances in various ways, e.g., depending on within care area position, depending on within specimen position, depending on neighboring polygons, depending on underlying polygons, etc. Noise characteristics may then be determined for these initial "sub-sub-groups" or "intermediate sub-groups." Depending on how similar or different those noise characteristics are, the polygon instances in the initial sub-group may be separated into two or more different final sub-groups.

In a hypothetical example, if 2D histograms are generated as described herein for various intermediate sub-groups identified in one or more of the ways described above, and all of the 2D histograms look similar to 2D histogram 600 shown in FIG. 6 (i.e., they all have substantially similar and relatively large dynamic ranges), then the intermediate sub-groups may be recombined into their original initial sub-group and designated as a single final sub-group (unless they are being combined with another initial sub-group to form a final sub-group). In contrast, if 2D histograms are generated as described herein for two intermediate sub-groups identified in one or more of the ways described above, and one of the 2D histograms looks similar to 2D histogram 800 shown in FIG. 8 and another of the 2D histograms looks similar to 2D histogram 802 shown in FIG. 8, then the intermediate sub-groups may be assigned to different final sub-groups. In addition, determining the final sub-groups for three or more intermediate sub-groups may include some combination of assigning one intermediate sub-group to a final sub-group and assigning two or more intermediate sub-groups to a different final sub-group. Furthermore, intermediate sub-group noise characteristics may be compared to the noise characteristics determined for other initial sub-groups (not just intermediate sub-groups), and based on similarities and differences between the noise characteristics, an intermediate sub-group may be combined with a sub-group into a final sub-group. In this manner, different subsets of polygons having the same characteristics on the specimen may be included in final sub-groups with other, non-similar polygons in terms of polygon characteristics. Final sub-groups generated in such a way may otherwise be treated as described further herein thereby allowing different instances of the same polygon to be inspected with different defect detection methods and/or parameters.

The computer subsystem(s) are further configured for selecting first and second defect detection methods for application to the output generated by the detector of the inspection subsystem during inspection of the specimen or another specimen of the same type for a first and a second of the final sub-groups, respectively, based on the characteristic of the noise determined for the first and second of the final sub-groups, respectively. For example, as shown in step 306 of FIG. 3, the computer subsystem(s) may select defect detection methods for the final sub-groups. The specimens for which the inspection is performed may be of the same type in that they may be subject to the same fabrication processes prior to having the inspection performed thereon.

Since the final sub-groups are determined as described herein so that different final sub-groups exhibit different noise characteristics, in general, the defect detection methods selected for different final sub-groups will most likely be different (although not necessarily for all final sub-groups). For example, the first and second defect detection methods will in general be different from each other because different final sub-groups will in general have different noise characteristics. However, for two or more of the final sub-groups, the same defect detection method may be selected in some instances. If the same defect detection method is selected for two or more of the final sub-groups, the parameters of the defect detection method may be independently and separately tuned for each of the two or more final sub-groups so that the defect detection method is tailored for different final sub-groups.

The first and second defect detection methods may therefore be selected separately and independently for final sub-groups of polygons having different noise characteristics, which enables using the most sensitive defect detection method possible for each of the final sub-groups. For example, the defect detection method that can detect the most DOIs without prohibitive levels of nuisance detection may be independently selected for each of the final sub-groups based on the noise characteristics determined for each of the final sub-groups. The inspection of the specimen or another specimen of the same type may then include defect detection performed using a combination of care area final sub-groups and defect detection methods or algorithms selected for those care area final sub-groups. In this manner, the embodiments described herein provide sensitivity enhancement by care area division and re-grouping.

The first and second defect detection methods that are selected may be completely different types of defect detection methods (not just the same defect detection method with one or more different parameters such as threshold). Both of the first and second defect detection methods may also include any suitable defect detection method known in the art, some examples of which are described herein. For example, one of the first and second defect detection methods may include a multi-die adaptive threshold (MDAT) algorithm, which is available on some inspection systems commercially available from KLA. The MDAT algorithm performs candidate to reference image comparisons by image frame subtraction and identifies outliers based on signal-to-noise through double detection (compares a candidate image to two reference images) or single detection when compared to a median reference frame of more than two frames. One of the first and second defect detection methods may also or alternatively include a multi-computed die adaptive threshold (MCAT) algorithm, which is also available on some inspection systems commercially available from KLA. In general, this defect detection algorithm is similar to the MDAT algorithm but optimizes the reference to be similar to the test image frame before image subtraction is performed. In addition, one of the first and second defect detection methods may include a MCAT+ algorithm, which is also available on some currently available inspection systems from KLA, and which is an algorithm similar to MCAT but uses references from across the wafer. One of the first and second defect detection methods may further include a single reference die (SRD) defect detection method or algorithm, which is available on some commercially available inspection systems from KLA. This defect detection algorithm uses a reference die from the same or different wafer as a reference (for subtraction from test images).

In one embodiment, at least one of the first and second defect detection methods includes generating a one-dimensional (1D) histogram for the output generated by the detector of the inspection subsystem during the inspection. A defect detection method that generates a 1D histogram for the detector output may be referred to as a 1D defect detection method. In one embodiment, the one-dimensional histogram is generated from grey levels in difference images generated from the output generated by the detector of the inspection subsystem during the inspection. For example, a 1D defect detection method or algorithm may use a 1D histogram for outlier detection with the difference grey level on the x axis. The 1D histogram may therefore show defect count over the difference grey level. In this manner, the embodiments described herein may combine care area modification with 1D defect detection, i.e., threshold setting based on a 1D image histogram. In contrast, a "2D defect detection algorithm" as that term is used herein is an algorithm that uses a 2D histogram with one axis being, for example, the median grey level of n>1 reference frames (y axis) and the x axis being the difference grey level (such as the histograms shown in the figures described herein). In addition, the noise scan performed for determining the characteristic of the noise as described herein may match the selected defect detection method (i.e., it may generate difference images, histograms, etc. in the same manner that a defect detection method would and determine the noise characteristics from those results).

The defect detection methods that are selected as described herein may also include a 1D analog for any 2D defect detection methods known in the art. For example, every currently used 2D defect detection algorithm has a 1D counterpart. In some such examples, the defect detection algorithms mentioned herein can have both 1D and 2D versions (e.g., 1D MDAT and 2D MDAT; 1D MCAT and 2D MCAT; 1D MCAT+ and 2D MCAT+; 1D SRD and 2D SRD), and which version is selected for defect detection in any one of the final sub-groups may be selected as described herein. The care area modification described herein is therefore an enabler of 1D defect detection.

In another embodiment, one of the first and second defect detection methods includes generating a 1D histogram for the output generated by the detector of the inspection subsystem during the inspection, and another of the first and second defect detection methods includes generating a 2D histogram for the output generated by the detector of the inspection subsystem during the inspection. For example, the first and second defect detection methods may be selected to combine a 2D histogram defect detection method for final care area sub-groups with relatively high dynamic range (e.g., group 1 shown in FIG. 9) and 1D defect detection for areas with relatively low dynamic range (e.g., group 2 shown in FIG. 9). In other words, if the polygons can be divided into final sub-groups that all have a relatively low median grey level range and so that every final sub-group is substantially noise pure, then a 1D version of a defect detection method may be suitable for use with the final sub-groups. If that is not the case or only some care area final sub-groups are substantially noise pure, then the computer subsystem(s) may select a 2D version of a defect detection method for the noise "impure" care area final sub-groups and a 1D version of a defect detection method for the noise "pure" care area final sub-groups. In addition, different versions of the same defect detection method may be selected for different final sub-groups. For example, if there is a repeater defect in every printed instance of a reticle on a wafer, which is the case for mint check wafers, then the defect detection method selected for two or more of the final sub-groups may be an SRD method or algorithm since this defect detection method has a "golden" non-defective reference. For each of the two or more final sub-groups for which SRD is selected, a 1D or 2D version of the algorithm could be selected independently for each final sub-group depending on the noise purity of each final sub-group.

In a further embodiment, the one or more computer subsystems are configured for separately tuning one or more parameters of the first and second defect detection methods. For example, for each care area final sub-group, a threshold offset of 0 may be defined, e.g., based on the $\mu +/- 3*\sigma$. In one such example, the computer subsystem(s) may create a histogram of the difference image, e.g., by plotting the number of pixels over difference grey level. The computer subsystem(s) may then calculate the statistical moments of this histogram such as $\mu$ and $\sigma$. In most cases, the $\mu$ should be substantially close to a difference grey level of zero. If the $\sigma$ value is at, say, 20 difference grey levels and the threshold is to be set at 3 times $\sigma$, then this means that the threshold will be at 60 difference image grey levels. Of course, this is just an example and other statistical values can be used to set the threshold.

The user can then specify which threshold should be applied when performing defect detection. For example, the user can select the threshold value as they like if the default setting is not sufficient. The user could set the threshold value based on the number of outliers that are detected using a certain threshold and if there is, for example, a limit (e.g., a capture rate threshold).

As an alternative, the offset 0 calculation can be performed based on every individual care area final sub-group and a threshold may be applied to all of those. The offset set equal to zero refers to the difference grey level where everything lower than that difference grey level is considered noise and everything higher than that is considered outliers. Depending on the defect detection method that is used, this zero value may be used instead of $\mu$.

In this manner, user- or automatically-defined thresholds for the final care area sub-groups may be defined and applied during inspection. In addition, sensitivity tuning can be performed for different final sub-groups separately and independently. Sensitivity tuning may also be performed in any other suitable manner known in the art.

The computer subsystem(s) may also be configured for storing information for the selected first and second defect detection methods for use in inspection of the specimen or another specimen of the same type. The computer subsystem(s) may be configured to store the information in a recipe or by generating a recipe for the inspection in which the first and second defect detection methods will be applied. A "recipe" as that term is used herein is defined as a set of instructions that can be used by a tool to perform a process on a specimen. in this manner, generating a recipe may include generating information for how a process is to be performed, which can then be used to generate the instructions for performing that process. The information for the first and second defect detection methods that is stored by the computer subsystem(s) may include any information that can be used to identify, access, and/or use the selected defect detection methods (e.g., such as a file name and where it is stored). The information for the selected defect detection methods that is stored may also include the actual defect detection method code, instructions, algorithms, etc. for performing the defect detection methods.

The computer subsystem(s) may be configured for storing the information for the selected defect detection methods in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc. For example, the embodiments described herein may generate an inspection recipe as described above. That inspection recipe may then be stored and used by the system or method (or another system or method) to inspect the specimen or other specimens to thereby generate information (e.g., defect information) for the specimen or other specimens.

Results and information generated by performing the inspection on the specimen or other specimens of the same type may be used in a variety of manners by the embodiments described herein and/or other systems and methods. Such functions include, but are not limited to, altering a process such as a fabrication process or step that was or will be performed on the inspected specimen or another specimen in a feedback or feedforward manner. For example, the virtual system and other computer subsystem(s) described herein may be configured to determine one or more changes to a process that was performed on a specimen inspected as described herein and/or a process that will be performed on the specimen based on the detected defect(s). The changes to the process may include any suitable changes to one or more parameters of the process. The virtual system and/or other computer subsystem(s) described herein preferably determine those changes such that the defects can be reduced or prevented on other specimens on which the revised process is performed, the defects can be corrected or eliminated on the specimen in another process performed on the specimen, the defects can be compensated for in another process performed on the specimen, etc. The virtual system and other computer subsystem(s) described herein may determine such changes in any suitable manner known in the art.

Those changes can then be sent to a semiconductor fabrication system (not shown) or a storage medium (not shown) accessible to the virtual system or other computer subsystem(s) described herein and the semiconductor fabrication system. The semiconductor fabrication system may or may not be part of the system embodiments described herein. For example, the virtual system, other computer subsystem(s), and/or inspection subsystem described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

As described herein, therefore, the embodiments can be used to setup a new inspection process or recipe. The embodiments may also be used to modify an existing inspection process or recipe, whether that is an inspection process or recipe that was used for the specimen or was created for one specimen and is being adapted for another specimen. However, the embodiments described herein are not just limited to inspection recipe or process creation or modification. For example, the embodiments described herein can also be used to setup or modify a recipe or process for metrology, defect review, etc. in a similar manner. In particular, the separating polygons, determining a characteristic of noise, and determining final sub-groups steps described herein can be performed regardless of the process that is being setup or revised. Then, depending on the process or recipe that is being setup or altered, the selecting step may be performed to select one or more output processing methods for different final sub-groups. Such output processing methods may include, for example, algorithms used to determine one or more characteristics of the polygons from output generated by a metrology system, defect re-detection methods used for re-detecting defects in output generated by a defect review system, etc. In a similar manner, the embodiments described herein may be used to select not just output processing parameters and methods but also output acquisition parameters or modes, which with, for example, a metrology system or a defect review system detects light, electrons, ions, etc. from a specimen. The embodiments described herein can therefore be used not just for setting up or modifying an inspection process but can be used for setting up or modifying any quality control type process performed on the specimens described herein.

The embodiments described herein provide a number of advantages over previously used methods and systems for setting up inspection processes that use care areas. For example, the embodiments described herein provide faster time to results as mode-algorithm combination decisions can be made during the initial mode/algorithm selection process. In addition, the embodiments described herein can identify relatively noisy areas much more reliably and even relatively small, manually hard to identify polygons can be sub-grouped correctly. Combining care areas into groups exhibiting different noise characteristics also improves overall inspection sensitivity since enhanced sensitivity can be achieved for less noisy groups. Furthermore, the embodiments described herein provide much better mitigation of within wafer and wafer-to-wafer process variation as groups which are less impacted by wafer noise variation are more stable. The embodiments described herein also allow increasing the sensitivity to certain DOIs. This selective DOI sensitivity will allow users to improve their ability to make correct processing decisions based on results of the inspection.

As an alternative to the embodiments described herein, inspection setup could include manually identifying noisy structures and performing design-based searches for the noisy structures to create new care areas. Such inspection setup could also include testing the new care area setup and finding additional noise sources. Such methods could then include going back and performing a design-based search for the newly identified noisy structures. However, unlike the embodiments described herein, this process can take many days and is too slow and often insufficient in terms of care area noise purity.

Each of the embodiments of each of the systems described above may be combined together into one single embodiment.

Another embodiment relates to a computer-implemented method for selecting defect detection methods for inspection of a specimen. The method includes the separating polygons, determining a characteristic, determining final sub-groups, and selecting first and second defect detection methods steps described above.

Each of the steps of the method may be performed as described further herein. The method may also include any other step(s) that can be performed by the inspection subsystem and/or computer subsystem(s) or system(s) described herein. The separating polygons, determining a characteristic, determining final sub-groups, and selecting first and second defect detection methods steps are performed by one or more computer subsystems, which may be configured according to any of the embodiments described herein. In addition, the method described above may be performed by any of the system embodiments described herein.

Figure 10:
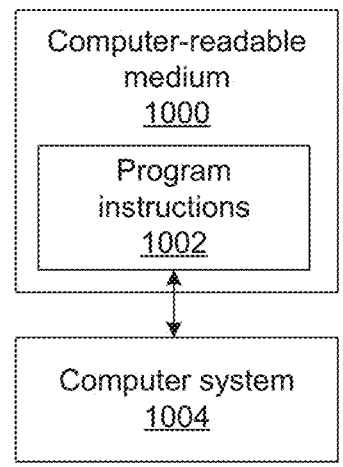
FIG. 10 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for selecting defect detection methods for inspection of a specimen. One such embodiment is shown in FIG. 10. In particular, as shown in FIG. 10, non-transitory computer-readable medium 1000 includes program instructions 1002 executable on computer system 1004. The computer-implemented method may include any step(s) of any method(s) described herein.

Program instructions 1002 implementing methods such as those described herein may be stored on computer-readable medium 1000. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC") SSE (Streaming SIMD Extension) or other technologies or methodologies, as desired.

Computer system 1004 may be configured according to any of the embodiments described herein.

Further modifications and alternative embodiments of various aspects of the invention will be apparent to those skilled in the art in view of this description. For example, methods and systems for selecting defect detection methods for inspection of a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for selecting defect detection methods for inspection of a specimen, comprising:
   one or more computer subsystems configured for:
      separating polygons in a care area on a specimen into initial sub-groups based on a characteristic of the polygons on the specimen such that the polygons having different values of the characteristic are separated into different initial sub-groups and such that all of the polygons in each of the different initial sub-groups have the same values of the characteristic;
      determining a characteristic of noise in output generated by a detector of an inspection subsystem for the polygons on the specimen in the different initial sub-groups, wherein the characteristic of the polygons on the specimen and the characteristic of noise are different from each other, and wherein determining the characteristic of the noise comprises determining the characteristic of the noise in the output generated by the detector of the inspection subsystem for the polygons on the specimen in combination with output generated by the detector of the inspection subsystem for the polygons in the different initial sub-groups on another specimen;
      determining final sub-groups for the polygons by combining any two or more of the different initial sub-groups having substantially the same values of the characteristic of the noise into one of the final sub-groups, wherein at least one of the final sub-groups comprise at least two of the polygons having different values of the characteristic; and selecting first and second defect detection methods for application to the output generated by the detector of the inspection subsystem during inspection of the specimen or the another specimen of the same type for a first and a second of the final sub-groups, respectively, based on the characteristic of the noise determined for the first and second of the final sub-groups, respectively.

2. The system of claim 1, wherein the characteristic of the polygons comprises a physical characteristic of the polygons.

3. The system of claim 1, wherein said separating is performed by projecting the polygons along one axis.

4. The system of claim 1, wherein the polygons in the care area comprise polygons on more than one layer of the specimen.

5. The system of claim 1, wherein the one or more computer subsystems are further configured for determining the characteristic of the polygons on the specimen from a design for the specimen.

6. The system of claim 1, wherein the one or more computer subsystems are further configured for determining the characteristic of the polygons on the specimen by rendering a design for the specimen.

7. The system of claim 1, wherein the output generated by the detector of the inspection subsystem used for determining the characteristic of the noise is generated by scanning the specimen and the another specimen with the inspection subsystem.

8. The system of claim 1, wherein determining the characteristic of the noise further comprises performing statistical analysis of the output.

9. The system of claim 1, wherein determining the characteristic of the noise further comprises determining the characteristic of the noise in the output generated by the detector of the inspection subsystem for the polygons on the specimen and the another specimen in the different initial sub-groups in more than one instance of the care area on the specimen and the another specimen.

10. The system of claim 1, wherein determining the characteristic of the noise and determining the final sub-groups are implemented as a noise scan functionality on the one or more computer subsystems and the inspection subsystem.

11. The system of claim 10, wherein the one or more computer subsystems and the inspection subsystem are configured for implementing the noise scan by collecting image frame data in the output generated by the detector of the inspection subsystem and calculating difference image frames according to a predetermined algorithm.

12. The system of claim 11, wherein the predetermined algorithm is the same as a predetermined algorithm used by at least one of multiple defect detection methods suitable for the inspection of the specimen or the another specimen from which the first and second defect detection methods are selected.

13. The system of claim 1, wherein at least one of the first and second defect detection methods comprises generating a one-dimensional histogram for the output generated by the detector of the inspection subsystem during the inspection.

14. The system of claim 13, wherein the one-dimensional histogram is generated from grey levels in difference images generated from the output generated by the detector of the inspection subsystem during the inspection.

15. The system of claim 1, wherein one of the first and second defect detection methods comprises generating a one-dimensional histogram for the output generated by the detector of the inspection subsystem during the inspection, and wherein another of the first and second defect detection methods comprises generating a two-dimensional histogram for the output generated by the detector of the inspection subsystem during the inspection.

16. The system of claim 1, wherein the one or more computer subsystems are further configured for separately tuning one or more parameters of the first and second defect detection methods.

17. The system of claim 1, wherein the specimen is a wafer.

18. The system of claim 1, wherein the specimen is a reticle.

19. The system of claim 1, further comprising the inspection subsystem comprising at least an energy source and the detector, wherein the energy source is configured to generate energy that is directed to the specimen, and wherein the detector is configured to detect energy from the specimen and to generate the output responsive to the detected energy.

20. The system of claim 1, wherein the inspection subsystem is a light-based inspection subsystem.

21. The system of claim 1, wherein the inspection subsystem is an electron-based inspection subsystem.

22. A non-transitory computer-readable medium, storing program
instructions executable on a computer system for performing a computer-implemented method
for selecting defect detection methods for inspection of a specimen, wherein the computer implemented method comprises:
separating polygons in a care area on a specimen into initial sub-groups based on a characteristic of the polygons on the specimen such that the polygons having different values of the characteristic are separated into different initial sub-groups and such that all of the polygons in each of the different initial sub-groups have the same values of the characteristic;
determining a characteristic of noise in output generated by a detector of an inspection subsystem for the polygons on the specimen in the different initial sub-groups, wherein the characteristic of the polygons on the specimen and the characteristic of noise are different from each other, and wherein determining the characteristic of the noise comprises determining the characteristic of the noise in the output generated by the detector of the inspection subsystem for the polygons on the specimen in combination with output generated by the detector of the inspection subsystem for the polygons in the different initial sub-groups on another specimen;
determining final sub-groups for the polygons by combining any two or more of the different initial sub-groups having substantially the same values of the characteristic of the noise into one of the final sub-groups, wherein at least one of the final sub-groups comprise at least two of the polygons having different values of the characteristic; and selecting first and second defect detection methods for application to the output generated by the detector of the inspection subsystem during inspection of the specimen or the another specimen of the same type for a first and a second of the final subgroups, respectively, based on the characteristic of the noise determined for the first and second of the final sub-groups, respectively.

23. A computer-implemented method for selecting defect detection methods for inspection of a specimen, comprising:

separating polygons in a care area on a specimen into initial sub-groups based on a characteristic of the polygons on the specimen such that the polygons having different values of the characteristic are separated into different initial sub-groups and such that all of the polygons in each of the different initial sub-groups have the same values of the characteristic;

determining a characteristic of noise in output generated by a detector of an inspection subsystem for the polygons on the specimen in the different initial sub-groups, wherein the characteristic of the polygons on the specimen and the characteristic of noise are different from each other, and wherein determining the characteristic of the noise comprises determining the characteristic of the noise in the output generated by the detector of the inspection subsystem for the polygons on the specimen in combination with output generated by the detector of the inspection subsystem for the polygons in the different initial sub-groups on another specimen;

determining final sub-groups for the polygons by combining any two or more of the different initial sub-groups having substantially the same values of the characteristic of the noise into one of the final sub-groups, wherein at least one of the final sub-groups comprise at least two of the polygons having different values of the characteristic; and selecting first and second defect detection methods for application to the output generated by the detector of the inspection subsystem during inspection of the specimen or the another specimen of the same type for a first and a second of the final subgroups, respectively, based on the characteristic of the noise determined for the first and second of the final sub-groups, respectively, wherein the separating, determining the characteristic, determining the final sub-groups, and the selecting are performed by one or more computer subsystems.

* * * * *